United States Patent
Guo et al.

(10) Patent No.: US 12,035,519 B2
(45) Date of Patent: Jul. 9, 2024

(54) SEMICONDUCTOR MEMORY DEVICE AND METHOD FOR FORMING THE SAME

(71) Applicant: Fujian Jinhua Integrated Circuit Co., Ltd., Quanzhou (CN)

(72) Inventors: Peng Guo, Quanzhou (CN); Yuanbao Wang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 101 days.

(21) Appl. No.: 17/673,828

(22) Filed: Feb. 17, 2022

(65) Prior Publication Data

US 2023/0164974 A1    May 25, 2023

(30) Foreign Application Priority Data

Nov. 19, 2021  (CN) .......................... 202111392126.4
Nov. 19, 2021  (CN) .......................... 202122854401.1

(51) Int. Cl.
*H10B 12/00*   (2023.01)
*H01L 29/06*   (2006.01)

(52) U.S. Cl.
CPC ......... *H10B 12/30* (2023.02); *H01L 29/0649* (2013.01); *H10B 12/482* (2023.02); *H10B 12/488* (2023.02)

(58) Field of Classification Search
CPC .... H10B 12/30; H10B 12/488; H10B 12/482; H10B 12/0355; H10B 43/27; H01L 29/0649; H01L 28/00
USPC .......................................... 257/401; 438/284
See application file for complete search history.

(56) References Cited

U.S. PATENT DOCUMENTS

2017/0213837 A1*   7/2017   Wang ................ H01L 27/10888

* cited by examiner

*Primary Examiner* — Thinh T Nguyen
(74) *Attorney, Agent, or Firm* — Winston Hsu

(57) ABSTRACT

The present invention discloses a semiconductor memory device and a forming method thereof. The semiconductor memory device includes a substrate, a plurality of bit lines, a strip-shaped isolation structure, a conductive residue, a plurality of columnar isolation structures and a plurality of conductive plugs. The bit lines are located on the substrate and extend along the first direction. The strip-shaped isolation structure is located at the ends of the bit lines and extends along the second direction, and the strip-shaped isolation structure includes a seam. In particular, the conductive residue is disposed in the seam. The columnar isolation structures are separated from each other and disposed between the bit lines. The conductive plugs are separated from each other and disposed between the bit lines, in which the conductive plugs and the conductive residue include the same conductive material.

13 Claims, 5 Drawing Sheets

SEMICONDUCTOR MEMORY DEVICE AND METHOD FOR FORMING THE SAME

BACKGROUND OF THE INVENTION

1. Field of the Invention

The present invention relates to a semiconductor memory device and a method for forming the same, and more particularly to a semiconductor memory device having a capacitor and a method for forming the same.

2. Description of the Prior Art

Dynamic random access memory (DRAM) is a kind of volatile memory, which is widely used as an important part in many electronic devices. The traditional DRAM consists of a plurality of memory cells gathered to form an array for data storage. Each memory cell may be composed of a metal oxide semiconductor (MOS) transistor and a capacitor in series.

Since the size of DRAM is continuously reduced with the improvement of integration, it becomes more and more difficult to build the electrical connection between memory cells. At the same time, transistors and capacitors in each memory cell of DRAM have many different structural designs due to product requirements and cell density. Therefore, how to improve the manufacturing process of DRAM is still a research hotspot in the related fields.

SUMMARY OF THE INVENTION

An object of the present invention is to provide a semiconductor memory device and a method for forming thereof To achieve the above objective, according to one embodiment of the present disclosure, a semiconductor memory device is provided, which includes: a substrate; a plurality of bit lines, disposed on the substrate, and extending along a first direction; a strip-shaped isolation structure, disposed at ends of the bit lines, in which the upper portion of the strip-shaped isolation structure includes a seam; a conductive residue, disposed in the seam; a plurality of columnar isolation structure, disposed between the bit lines and separated with each other; a plurality of conductive plugs, disposed between the bit lines and separated with each other, in which the conductive residue and the conductive plugs include the same conductive material.

According to another one embodiment, a method for fabricating a semiconductor memory device is provided, which includes: providing a substrate; forming a plurality of word lines in the substrate; forming a plurality of bit lines on the substrate, in which the bit lines extend along a first direction, and the word lines extend along a second direction; forming a plurality of filling patterns between the bit lines and at ends of the bit lines, and forming a plurality of first gaps surrounded by the filling patterns and the bit lines, in which the filling patterns are separated with each other; depositing a insulating material, to fill up the first gaps surrounded by the filling patterns and the bit lines, and forming a plurality of cavities surrounded by the insulating material in each of the first gaps respectively; etching the insulating material, to form a strip-shaped isolation structure and a plurality of columnar isolation structures, in which the cavity of the strip-shaped isolation structure is exposed to form a seam; after etching the insulating material, removing a portion of the filling patterns to form a plurality of second gaps, in which the second gaps are surrounded by the columnar isolation structures and the bit lines; and depositing a conductive material, to fill up the second gaps and the seam at the same time.

According to the embodiments of the present disclosure, since the conductive residue in the strip-shaped isolation structure may be etched, the conductive residue may not present a continuous distribution along a direction, and thus a unnecessary electrical connection may be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
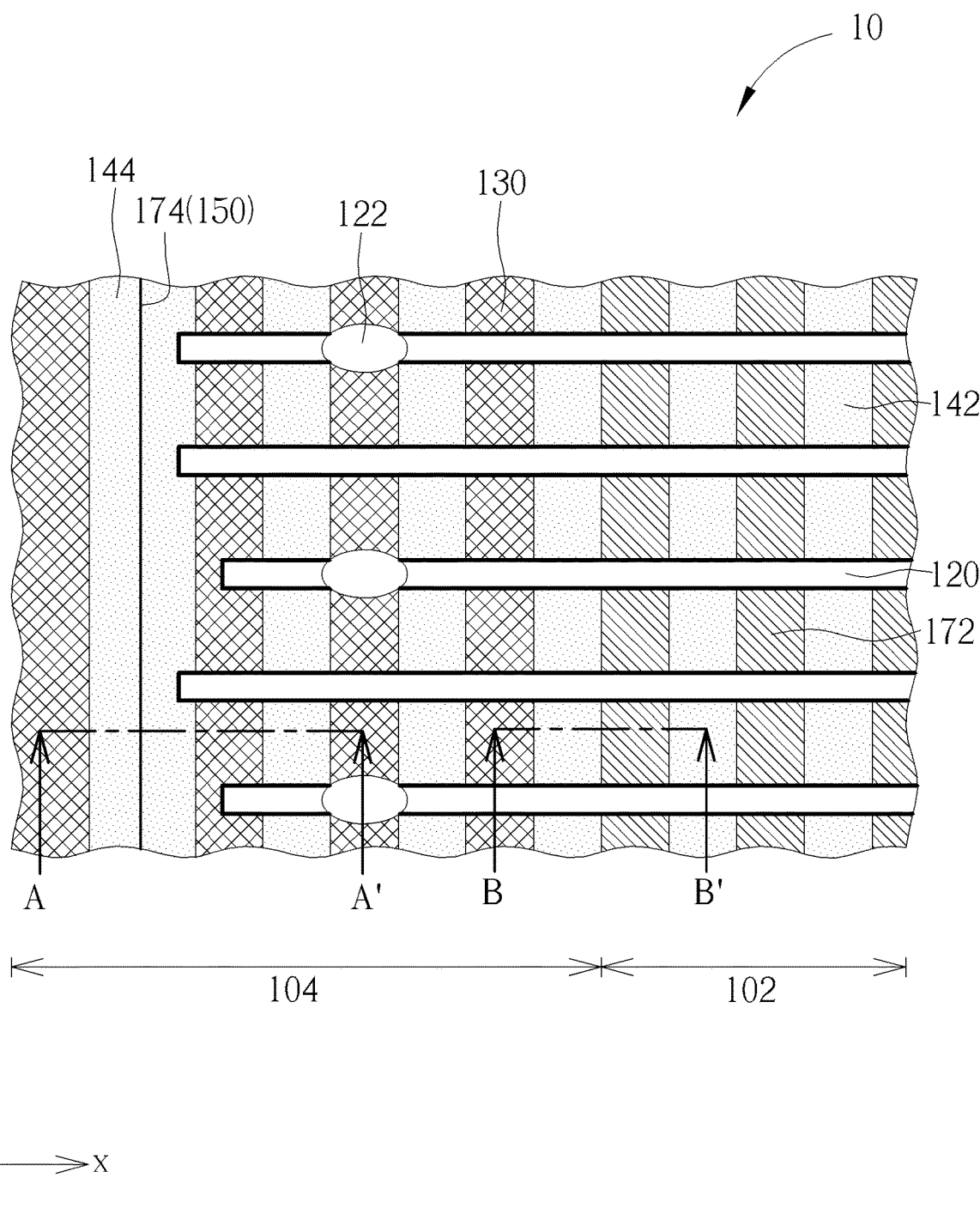
FIG. 1 is a schematic top view of the semiconductor memory device according to one embodiment of the present disclosure.

The semiconductor memory device and the forming method thereof provided by the present invention will be further described in detail with the drawings and the specific embodiments below. The advantages and the features of the present invention will become more concrete according to the following description. It should be noted that the drawings are all in a very simplified form and are all in inaccurate proportions, which are only used to facilitate and clearly support the embodiments of the present invention.

Preferred embodiments of the present invention are shown by numbered elements in the drawings. In addition, without departing from the scope of the present invention, the technical features in different embodiments described below can be replaced, recombined or mixed with each other to constitute another embodiment.

Figure 3:
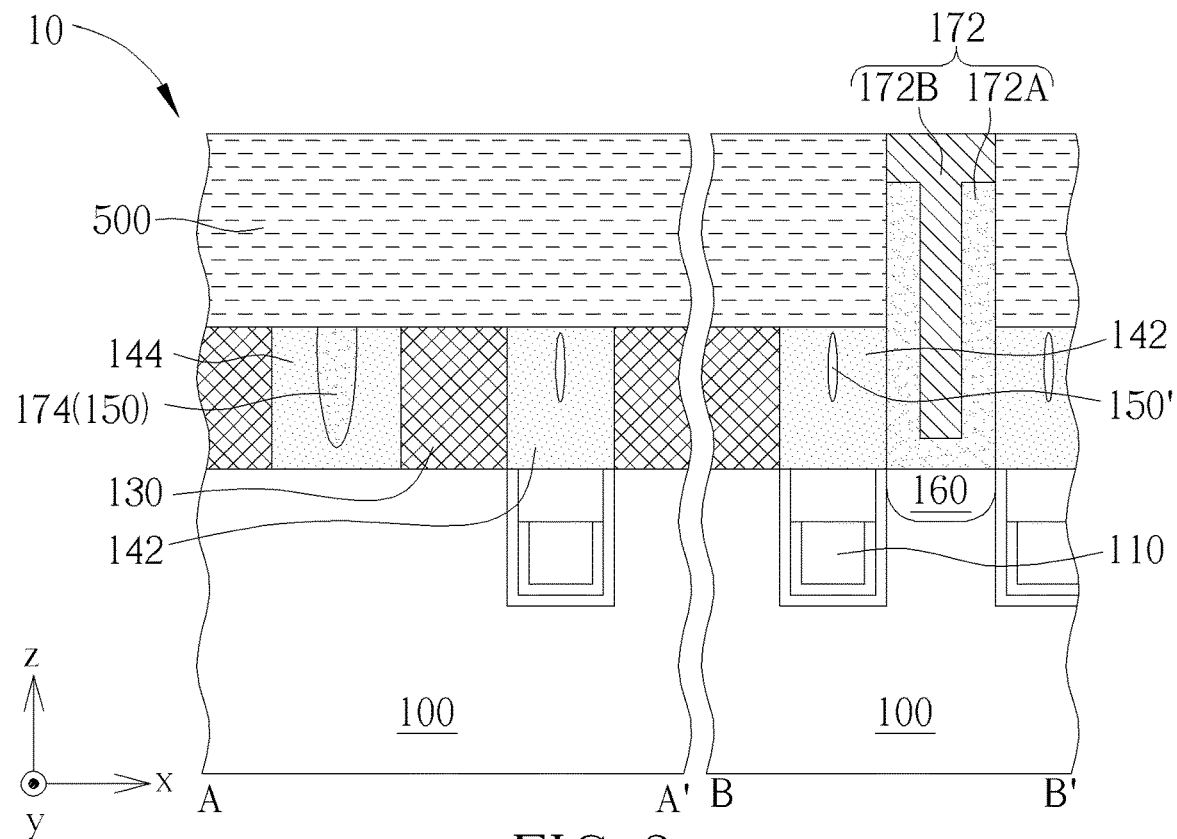
FIG. 3 is a schematic cross-sectional view of the semiconductor memory device along section lines AA' and BB' in FIG. 1.

FIGS. 1 and 3 show schematic diagrams of a semiconductor memory device according to one embodiment of the present invention, in which FIGS. 1 and 3 show a top view and a cross-sectional view of a semiconductor memory device 10, respectively. In the present embodiment, the semiconductor memory device 10 may be a dynamic random access memory device, for example, which includes a plurality of memory cells, and each memory cell may include at least one transistor structure (not shown) for switching electrical signals and at least one capacitor structure (not shown) for storing electrical signals. The semiconductor memory device 10 includes a substrate 100, such as a silicon substrate, an epitaxial silicon substrate or a silicon-on-insulator (SOI) substrate. A plurality of active areas (not shown) and isolation area (not shown) are defined in the substrate 100, and the active areas are arranged in parallel and spaced apart with each other at the plane formed by a first direction (x direction) and a second direction (y direction), and the adjacent active areas are separated by the isolation area. The material of the isolation area is an insulating material, which may surround the periphery of each active region, and thus the adjacent active areas are electrically insulated from each other. A plurality of word lines (not shown) extending along the second direction (y direction) are disposed in the substrate 100, and each word line crosses over the corresponding active area (not shown) and the isolation area (not shown).

In one embodiment, the isolation area and the word lines in the semiconductor memory device may be formed by the following steps, but not limited thereto. First, at least one isolation area, such as a shallow trench isolation (STI, not shown), is formed in the substrate 100 to define the active areas (not shown) separated with each other in the substrate 100. Then, a plurality of trenches (not shown) are formed in the isolation area and the active areas, and each trench is parallel to each other and extends along the second direction (y direction). Then, the word lines may be formed by performing the following steps sequentially. Forming a dielectric layer conformally covering the surface of each trench; forming a gate dielectric layer conformally disposed in the lower half of the trench; filling buried gates in the lower half of each trench; and forming an insulating layer filling the upper half of each trench. For example, as shown in FIG. 3, the structure of the word lines 110 may include a stacked structure composed of the aforementioned material layers. The aforementioned fabricating method of the word lines is only an example, which may be further adjusted by those skilled in the art according to the known technology and actual requirements, and will not describe the details here.

As shown in FIG. 1, the semiconductor memory device 10 includes a memory cell region 102 and a periphery region 104 adjacent to the memory region 102. In some embodiments, the memory cell region 102 is surrounded by the peripheral region 104. For simplicity, only a portion of the memory cell region 102 and a portion of the peripheral region 104 are shown in FIG. 1. In particular, a plurality of memory cells are disposed in the memory cell region 102, and semiconductor devices, such as logic devices, arithmetic devices, microprocessors or other non-memory cells, are disposed in the peripheral region 104.

A plurality of bit lines 120 are disposed on the substrate 100, crossing through the peripheral region 104 and the memory cell region 102, for transmitting signals to or from each memory cell in the semiconductor memory device 10 to perform operations such as reading, writing or refreshing for each memory cell. In particular, the bit lines 120 are parallel to each other and extend along the first direction (x direction). The bit lines 120 may be made of conductive materials, which may include metals (such as copper, aluminum, gold, tungsten, titanium), metal alloys, carbon, conductive doped semiconductors or the combinations thereof. In addition, ends of the bit lines 120 located at the peripheral region 104 may also be connected to bit line end portions 122. The bit line end portions 122 of the bit lines have a larger width in the second direction (y direction) compared with the bit lines, and thus the contact resistance (Rc) between the bit lines 120 and the external interconnections may be relatively low by disposing plugs on the bit line end portions 122. In particular, the bit line end portions 122 may be made of the same conductive material as the bit lines 120, but not limited thereto.

In the peripheral region 104, a strip-shaped isolation structure 144 is disposed at the ends of the bit lines 120 in the peripheral region 104 and extends along the second direction (y direction). In particular, the upper portion of the strip-shaped isolation structure 144 includes seam 150 along a third direction (z direction), and preferably, an opening of the seam 150 is exposed at a topmost surface of the strip-shaped isolation structure 144. In particular, the strip-shaped isolation structure 144 may be made of insulating materials, and the composition of the insulating materials may be, for example, oxide, nitride, oxynitride and/or the combination thereof, but not limited thereto. In one embodiment, the strip-shaped isolation structure 144 partially contacts with the bit lines 120, for example, the strip-shaped isolation structure 144 may contact an end of at least one bit line 120. In one embodiment, the seam 150 extends along the second direction (y direction) and presents continuous. In one embodiment, the opening of the seam 150 includes a width in the first direction (x direction), preferably, the width is greater than 1 nm. In one embodiment, the semiconductor memory device 10 may further include a plurality of filling patterns 130 disposed on the substrate 100 in the peripheral region 104, which are used to insulate the adjacent bit lines 120, define the positions of other components in the semiconductor memory device 10, and maintain the mechanical strength of the semiconductor memory device 10. In one embodiment, the filling patterns 130 may be formed by the following steps, but not limited thereto. Specifically, a filling material layer (not shown) is formed on the substrate 100 and the bit lines 120. The filling material layer may be any suitable insulating material, including, but not limited to, silicon oxide, silicon nitride, silicon oxynitride, spin-on glass, boron-doped or phosphorus-doped silicon oxide, carbon-doped oxide, fluorine-doped oxide or any combination thereof. The filling material layer may be formed by, for example, ALD, PVD, CVD, spin coating, sputtering or other suitable thin film deposition processes. Then, a patterning process is performed to pattern the filling material layer to form the filling patterns 130 separated with each other as shown in FIG. 1. Optionally, the filling patterns 130 may be disposed on both sides of the strip-shaped isolation structure 144 along the second direction (y direction).

In the memory cell region 102, a plurality of columnar isolation structures 142 are separately disposed from each other between the bit lines 120, and cover the substrate 100, so as to isolate the bit lines 120 from being electrically connected with other peripheral components on the substrate 100. In particular, the columnar isolation structures 142 may be made of the same insulating material as the strip-shaped isolation structure 144, but not limited thereto. Optionally, the filling pattern 130 may also be disposed between the strip-shaped isolation structure 144 and the columnar isolation structures 142. Optionally, the filling patterns 130 may be disposed between the bit lines 120 and the columnar isolation structures 142. Optionally, the filling patterns 130 may be disposed between at least two adjacent columnar isolation structures 142. Optionally, there may be an etching selectivity ratio between the filling patterns 130 and the columnar isolation structures 142. From the top view as FIG. 1, the columnar isolation structures 142 may be such as rounded or square block-shaped structures. Preferably, the upper portions of the columnar isolation structures 142 do not include the exposed seam 150. In one embodiment, the width of the strip-shaped isolation structures 144 in the first direction (x direction) is greater than the width of each columnar isolation structure 142 in the first direction (x direction).

In addition, a plurality of conductive plugs 172 are separately disposed from each other in the memory cell area 102 and between the bit lines 120 in the memory cell area 102. Preferably, the bit lines 120 are electrically connected to a portion of the substrate 100, and the conductive plugs 172 are electrically connected to another portion of the substrate 100. From the top view as FIG. 1, the conductive plugs 172 may be such as rounded or square block structures. Optionally, the conductive plugs 172 are disposed between adjacent columnar isolation structures 142, and the topmost surfaces of the conductive plugs 172 are higher than the topmost surfaces of the columnar isolation structures 142. On the other hand, a conductive residue 174 is disposed in the seam 150 of the strip-shaped isolation structure 144, and preferably, the conductive residue 174 fills up the seam 150, and the topmost surface of the conductive residue 174 is coplanar with the topmost surface of the strip-shaped isolation structure 144. Optionally, the conductive residue 174 and each conductive plug 172 include the same conductive material. In one embodiment, the conductive residue 174 is electrically insulated from the substrate 100.

Figure 2:
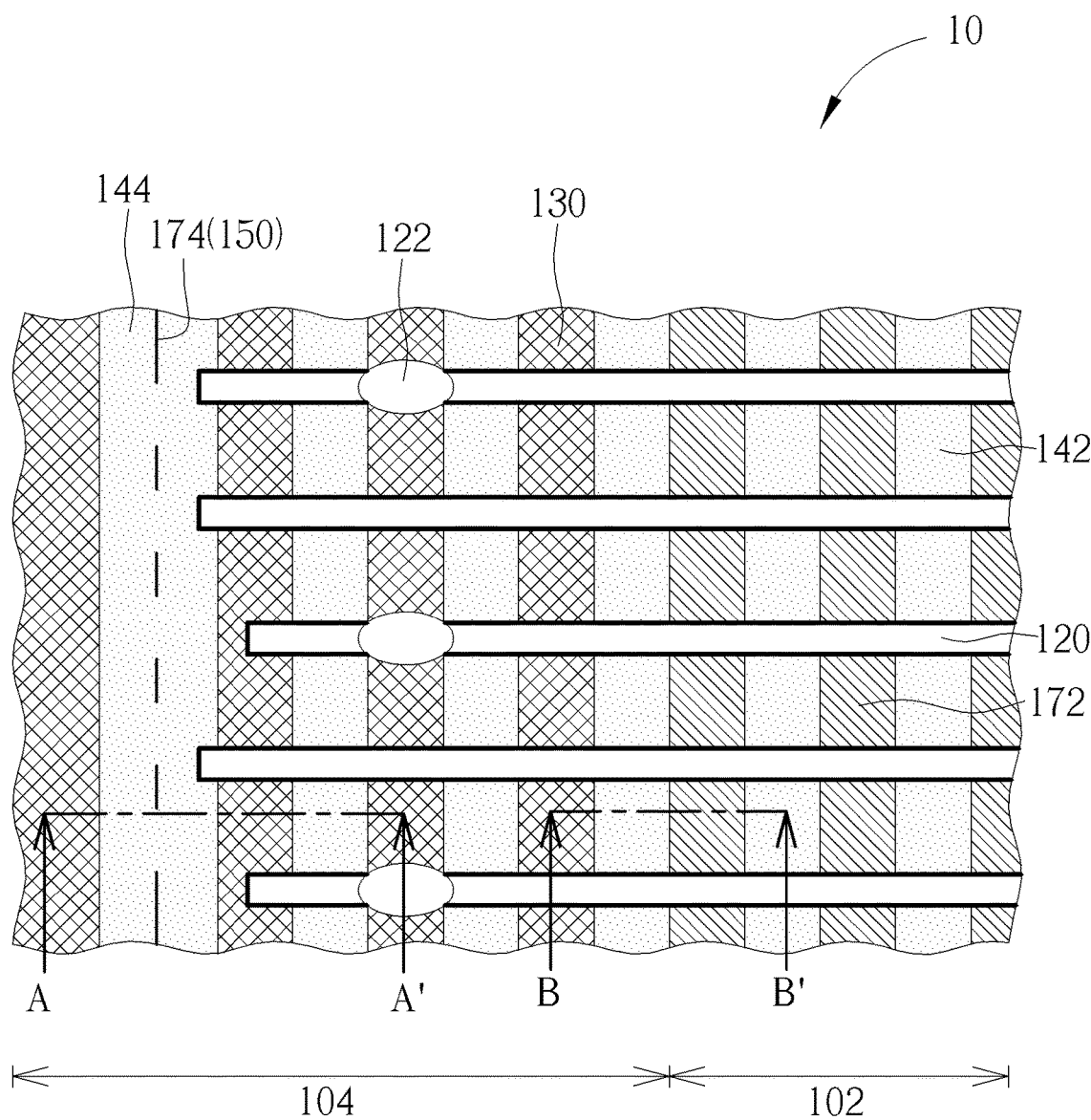
FIG. 2 is a schematic top view of the semiconductor memory device according to another one embodiment of the present disclosure.

FIG. 2 shows a top view of a semiconductor memory device according to another embodiment of the present invention. The semiconductor memory device 10 shown in FIG. 2 is similar to the semiconductor memory device 10 shown in FIG. 1, with the difference that the conductive residue 174 disposed in the seam 150 of the strip-shaped isolation structure 144 in FIG. 2 is discontinuously distributed in the second direction (y direction). The reason why the conductive residue 174 is discontinuously distributed in the second direction (y direction) may be attributed to the fact that the bottommost surface of the seam 150 has different depths at different positions along the y direction (the depth is parallel to the third direction), and thus the conductive residue 174 may only fill part of the gap 150.

FIG. 3 is a schematic cross-sectional view of the semiconductor memory device along section lines AA' and BB' in FIG. 1. Hereinafter, the features not shown in FIG. 1 are complemented by the cross-sectional view shown in FIG. 3. As shown in FIG. 3, a doped area 160 is also formed in the substrate 100, in which the doped area 160 is a part of the active areas, the conductivity type of the doped area 160 may be N type or P type, and the top surface of the doped area 160 may be coplanar with the substrate 100. A plurality of buried word lines 110 are also formed in the substrate 100 for electrically switching on and off each memory cell in the semiconductor memory device to perform operations such as reading, writing or refreshing for each memory cell. The word lines 110 are parallel to each other, and extend along the second direction (y direction) to cross over the active areas below.

In one embodiment, each columnar isolation structure 142 is provided with a cavity 150', and the cavity 150' may be completely covered by the corresponding columnar isolation structures 142. In contrast, the strip-shaped isolation structure 144 is provided with a seam 150. The seam 150 may be filled with the conductive residue 174, and the top surface of the seam 150 includes an opening.

In one embodiment, the semiconductor memory device 10 may further include an insulating layer 500, which covers the strip-shaped isolation structure 144, the conductive residue 174 and the columnar isolation structures 142. Optionally, the bottommost surface of the insulating layer 500 directly contacts the conductive residue 174. Optionally, the topmost surface of the insulating layer 500 is flush with the topmost surface of each conductive plug 172. In one embodiment, each conductive plug 172 includes a bottom conductive layer 172A and a top conductive layer 172B, in which the material of the bottom conductive layer 172A is different from the material of the top conductive layer 172B, and the bottom conductive layer 172A and the conductive residue 174 include the same conductive material. For example, the bottom conductive layer 172A may be a conductive material with better gap filling capability such as titanium nitride and tungsten nitride, and the top conductive layer 172B may be a material with low resistivity such as aluminum or copper. Optionally, the bottom conductive layer 172A covers and directly contacts the doped area 160 and the two adjacent columnar isolation structures 142 near the doped area 160, and presents a U-shaped structure. A top conductive layer 172B is disposed on the bottom conductive layer 172A and fills up the U-shaped structure of the bottom conductive layer 172A.

In order to enable those skilled in the art to realize the present invention, the following specification further describes the fabricating method of the semiconductor memory device of the present invention. Please refer to FIG. 4 to FIG. 8, which are schematic diagrams showing a method for forming a semiconductor memory device according to one embodiment of the present disclosure.

Figure 4:
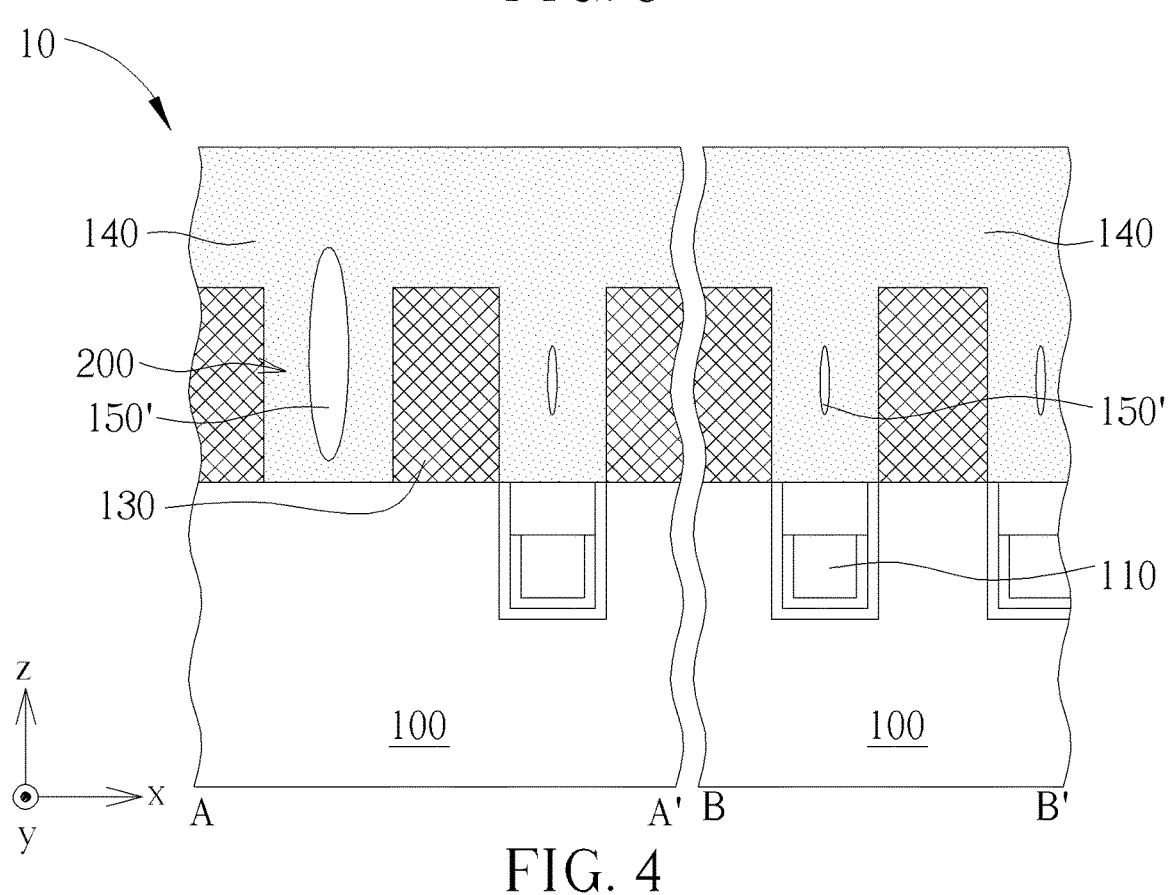
FIGS. 4 to 8 are schematic diagrams showing a method for forming a semiconductor memory device according to one embodiment of the present disclosure.

First, as shown in FIG. 4, a substrate 100, such as a silicon substrate, an epitaxial silicon substrate or a silicon-on-insulator (SOI) substrate, is provided. In particular, a shallow trench isolation (not shown) and active areas (not shown) are formed in the substrate 100, and the active areas are arranged in parallel and spaced apart with each other at the plane formed by a first direction (x direction) and a second direction (y direction), and the adjacent active areas are separated by the isolation area. The material of the isolation area is an insulating material, which may surround the periphery of each active region, and thus the adjacent active areas are electrically insulated from each other. A plurality of buried word lines 110 are also formed in the substrate 100 for receiving and transmitting voltage signals of each memory cell in the semiconductor memory device. In particular, the word lines 110 are parallel to each other and extend along the second direction (y direction) to cross over the active areas. It should be noted that, the detailed features and the fabricating method for the word lines 110 have already been described above, and will not describe the details here.

Next, a plurality of bit lines 120 are formed on the substrate 100, where each bit line 120 extends along the first direction (x direction). In one embodiment, the bit lines 120 may be formed by a self-aligned double patterning (SADP) process or a self-aligned reverse patterning (SARP) process, but not limited thereto. In some embodiments, according to actual requirements, the bit lines 120 may have different extension lengths, or they may all have the same length and be aligned with each other. When the bit lines 120 on the substrate 100 are formed, bit line end portions 122 may also be formed at ends of bit lines in the peripheral region 104, and the bit line end portions 122 are electrically connected to the bit lines 120 at the ends of the bit lines in the peripheral region 104, thereby increasing the contact area of the bit lines 120 to external connections to obtain a relatively low contact resistance (Rc) between the bit lines 120 and the external connections.

After the bit lines 120 are formed on the substrate 100, a plurality of filling patterns 130 separated from each other are formed between the bit lines 120 and at the ends of the bit lines 120. Specifically, a filling material layer (not shown) is first formed on the substrate 100 and the bit lines 120. The filling material layer may be any suitable insulating material, including, but not limited to, silicon oxide, silicon nitride, silicon oxynitride, spin-on glass, boron-doped or phosphorus-doped silicon oxide, carbon-doped oxide, fluorine-doped oxide or the combination thereof. The filling material layer may be formed by, for example, ALD, PVD, CVD, spin coating, sputtering or other suitable thin film deposition processes. Then, a patterning process is performed to pattern the filling material layer to form the filling patterns 130 separated from each other, and a plurality of first gaps 200 surrounded by a plurality of filling patterns 130 and a plurality of bit lines 120.

In one embodiment, the width of the first gap 200 along the first direction (x direction) in the peripheral region 104 is greater than the width of the first gap 200 along the first direction (x direction) in the memory cell region 102.

After the filling patterns 130 are formed between the bit lines 120 and at the ends of the bit lines 120, a insulating material 140 is deposited to fill the first gaps 200 surrounded by the filling patterns 130 and the bit lines 120, and a plurality of cavities 150' surrounded by the insulating material 140 are formed in the first gaps 200 respectively. The composition of the insulating material 140 may be, for example, oxide, nitride, oxynitride or/or a combination thereof, but it is not limited thereto. Optionally, the cavities 150' are completely covered by the insulating material 140, that is, the insulating material 140 does not expose the topmost surface of the cavities 150'. Each cavity 150' may extend along the second direction (y direction), and the cavity 150' may present discontinuous in the second direction.

In one embodiment, since the width of the first gaps 200 in the peripheral region 104 in the first direction (x direction) is larger than the width of the first gaps 200 in the memory cell region 102 in the first direction (x direction), when the insulating material 140 is deposited to fill the first gaps 200, the width in the first direction (x direction) and the height in the third direction (z direction) of the cavities 150' in the first gaps 200 in the peripheral region 104 are larger than the corresponding width and the corresponding height of the cavities 150' in the first gaps 200 in the memory cell region 102. Preferably, the heights of the cavities 150' in the first gaps 200 in the memory cell region 102 in the third direction (z direction) are lower than the topmost surface of the filling pattern 130 in the third direction (z direction), however, the heights of the cavities 150' in the first gaps 200 of the peripheral region 104 in the third direction (z direction) are higher than the topmost surface of the filling pattern 130 in the third direction (z direction).

Figure 5:
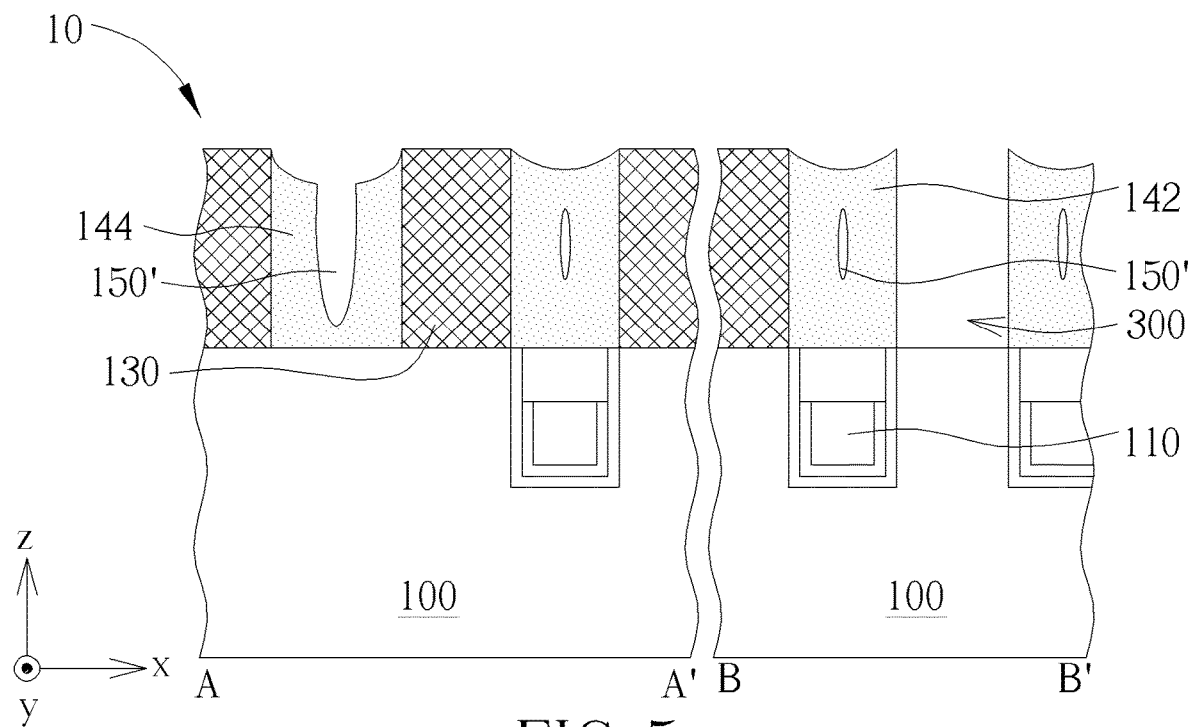

After the insulating material 140 is deposited to fill in the first gaps 200 surrounded by the filling patterns 130 and the bit lines 120, as shown in FIG. 5, the insulating material 140 is subjected to a planarization process to form a strip-shaped isolation structure 144 and column-shaped isolation structures 142. In particular, the cavity 150' in the strip-shaped isolation structure 144 is exposed to form a seam 150. Specifically, as seen from the top view (not shown), the strip-shaped isolation structure 144 may extend along the second direction (y direction), and the columnar isolation structures 142 may be such as rounded or square block structures. Optionally, the planarization process may be replaced or combined with an etching process, including but not limited to wet etching, dry etching or a combination thereof. Optionally, the width of the strip-shaped isolation structure 144 in the first direction (x direction) is larger than the width of each columnar isolation structure 142 in the first direction (x direction), and thus each cavity 150' in the columnar isolation structures 142 has a lower height in the third direction (z direction) than the cavity 150' in the strip-shaped isolation structure 144. When the insulating material 140 is etched, the cavity 150' in the strip-shaped isolation structure 144 may be exposed preferentially. In addition, the bottommost surface of the cavity 150' in the strip-shaped isolation structure 144 is closer to the substrate 100 than the bottommost surface of the cavities 150' in the columnar isolation structures 142 is in the third direction (z direction).

In one embodiment, the heights of the filling patterns 130 in the third direction (z direction) may be regarded as unchanged when the planarization process is performed, because there is an etching selectivity ratio between the filling patterns 130 and the columnar isolation structures 142 and/or the stripe isolation structure 144. Preferably, the heights of the columnar isolation structures 142 and the strip-shaped isolation structure 144 in the third direction (z direction) are smaller than the heights of the filling patterns 130 in the third direction (z direction).

In one embodiment, the seam 150 extends along the second direction (y direction) and is discontinuously distributed in the strip-shaped isolation structure 144. In one embodiment, an opening of the seam 150 has a width in the first direction (x direction), preferably, the width is greater than 1 nm.

After etching the insulating material 140, a portion of the filling patterns 130 may be removed to form a plurality of second gaps 300 surrounded by the columnar isolation structures 142 and the bit lines 120. In particular, all the removed filling patterns 130 are the filling patterns 130 in the memory cell region 102.

Figure 6:
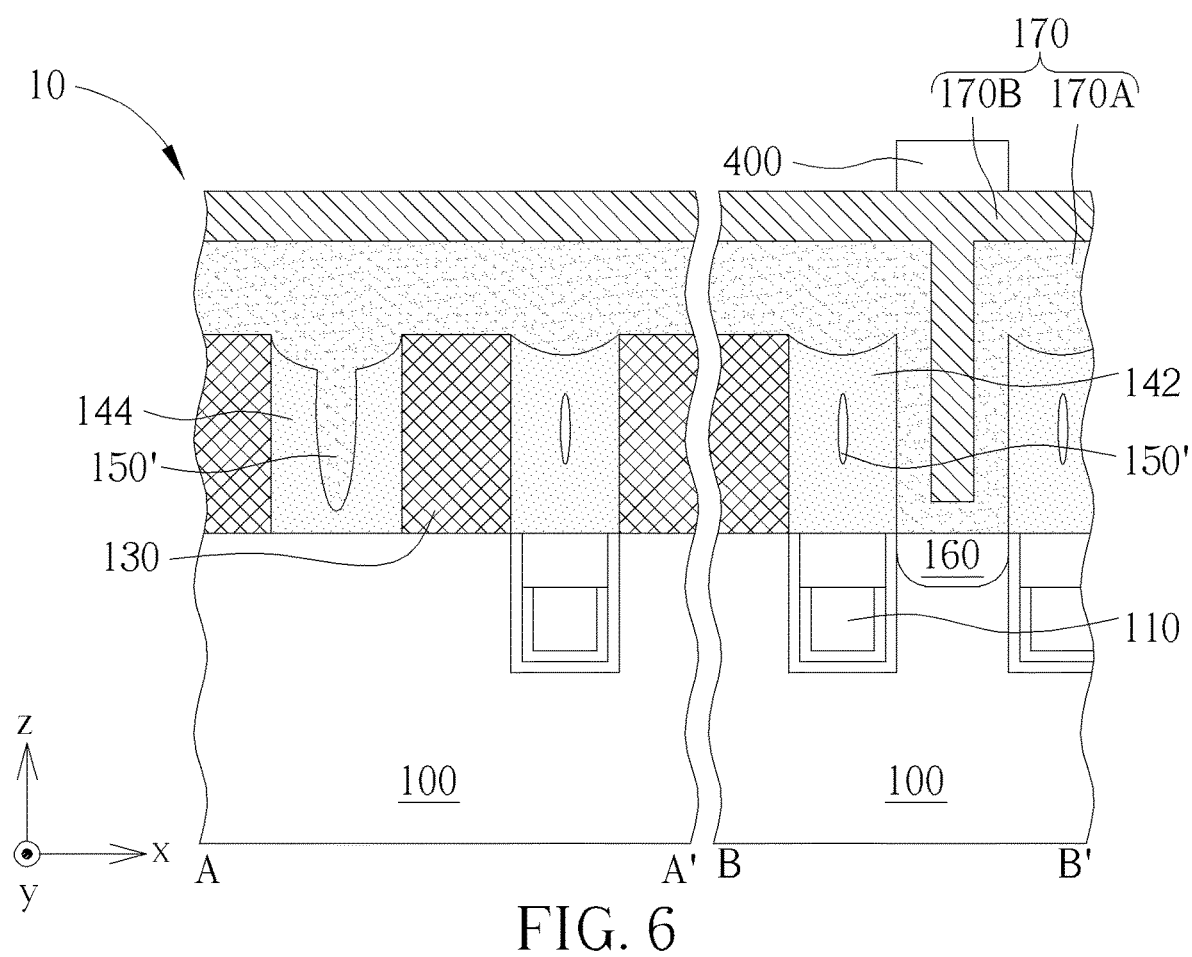

Then, as shown in FIG. 6, after removing the portion of the columnar isolation structures 142 to form the second gaps 300, a doped area 160 is formed in the substrate 100 exposed by the second gaps 300, in which the conductivity type of the doped area 160 may be N-type or P-type, and the top surface is coplanar with the substrate 100. Then, a conductive material 170 is deposited to fill in the second gaps 300 surrounded by the columnar isolation structures 142 and the bit lines 120, and the seam 150 is filled concurrently, in which the conductive material 170 filled in the seam 150 is electrically insulated from the substrate 100. The conductive material 170 may include a bottom conductive material 170A and a top conductive material 170B, in which the material of the bottom conductive material 170A is different from the material of the top conductive material 170B. Specifically, the conductive material 170A is deposited to fill in the second gaps 300 surrounded by the strip-shaped isolation structure 144, the columnar isolation structures 142 and the bit lines 120, and the seam 150 is filled with the conductive material 170A concurrently, and then the top conductive material 170B is deposited to cover the bottom conductive material 170A and fill up the second gaps 300.

In one embodiment, when the conductive material 170 is deposited, the filling patterns 130 may be disposed at the both sides of the strip-shaped isolation structure 144. In one embodiment, when the conductive material 170 is deposited, the filling patterns 130 may be disposed between the bit lines 120 and the columnar isolation structures 142.

Please refer to FIG. 6 again. As shown in FIG. 6, after the conductive material 170 is deposited, a plurality of mask patterns 400 are formed to align and cover a portion of the conductive material 170 located in the second gap 300.

Figure 7:
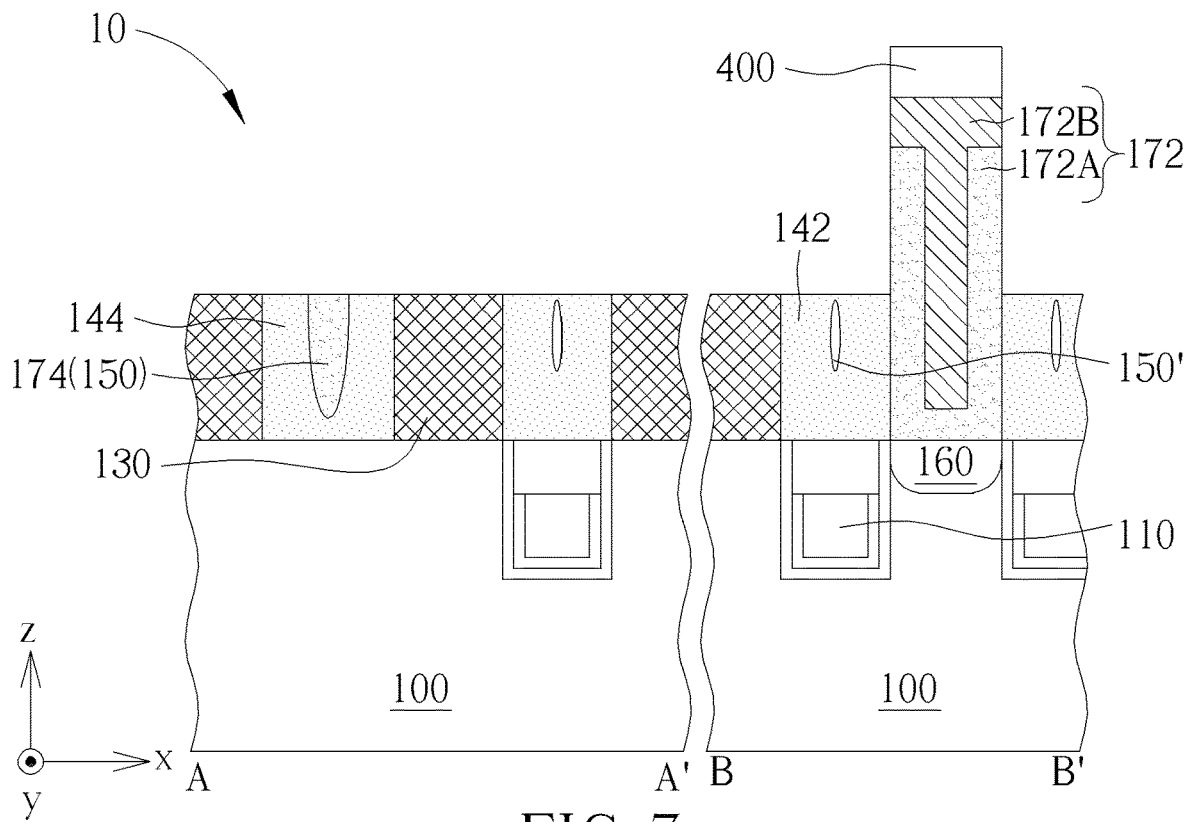

Then, as shown in FIG. 7, after forming the mask patterns 400, an etching process may be performed by using the mask patterns 400 as etching masks, in which the etching process may include dry etching, wet etching and reactive ion etching (RIE), but not limited thereto. After the etching process is completed, the conductive material 170 deposited in the seam 150 in the strip-shaped isolation structure 144 forms a conductive residue 174, the conductive material 170 deposited in the second gaps 300 forms a conductive plugs 172, and the conductive material 170 deposited on the filling patterns 130, the columnar isolation structures 142 and the strip-shaped isolation structure 144 is completely removed, and the filling patterns 130, the columnar isolation structures 142 and the strip-shaped isolation structure 144 are thereby exposed. In addition, each conductive plug 172 includes a bottom conductive layer 172A and a top conductive layer 172B, wherein the material of the bottom conductive layer 172A is the same as the material of the bottom conductive material 170A, and the material of the top conductive layer 172B is the same as that of the top conductive material 170B. Optionally, after the etching process is completed, a CMP process may also be performed, and the topmost surfaces of the filling patterns 130, the columnar isolation structures 142 and the strip-shaped isolation structure 144 may thereby be coplanar.

Figure 8:
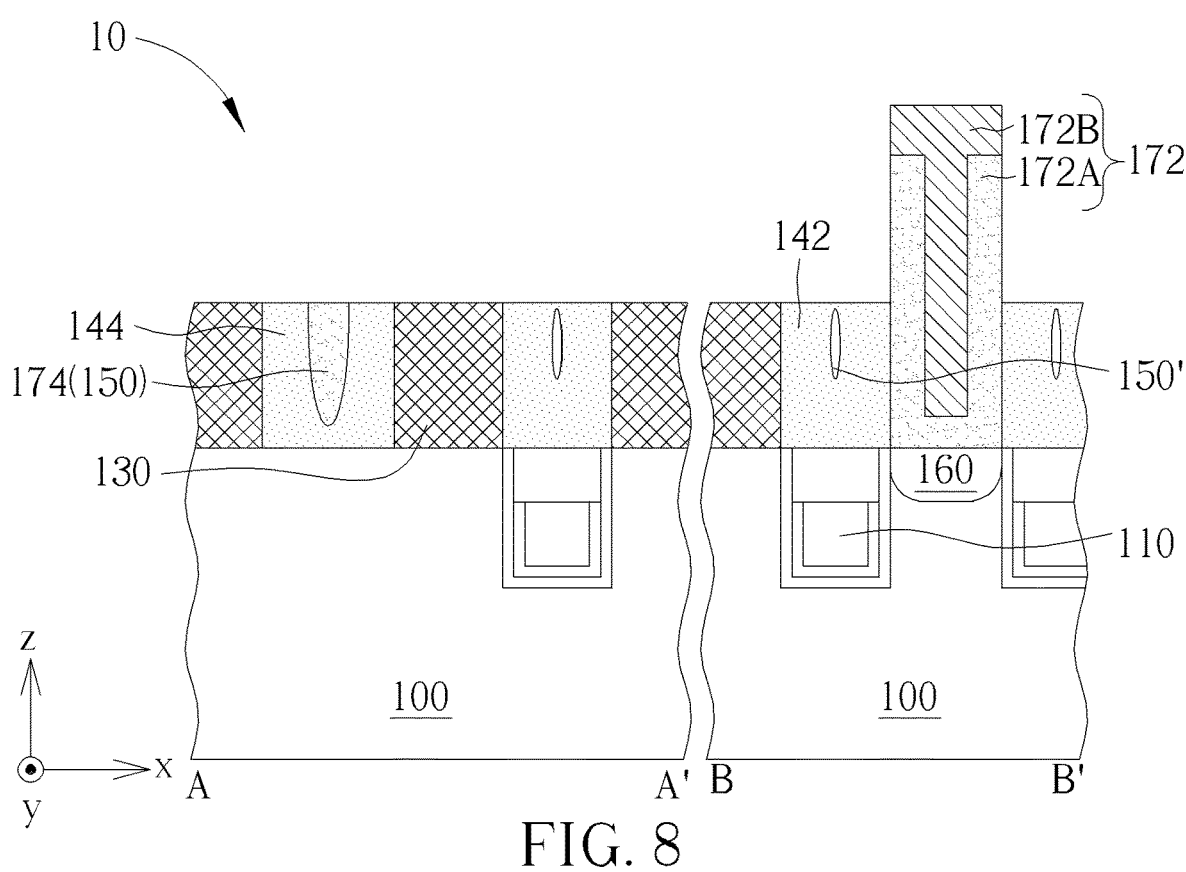

Finally, after the etching process is completed, the mask patterns 400 are removed to form the semiconductor memory device as shown in FIG. 8.

Thereafter, a insulating layer 500 surrounding the conductive plug 172 may be formed to form the semiconductor memory device as shown in FIG. 3. According to the requirements, other suitable semiconductor processes may be performed subsequently to form a capacitor structure (not shown) electrically connected with the conductive plug 172, and components such as an interconnection structure (not shown) and a pad (not shown) may be formed above the insulating layer 500, but not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate;
   a plurality of bit lines, disposed on the substrate and extending along a first direction;
   a strip-shaped isolation structure, disposed at ends of the plurality of bit lines and extending along a second direction, wherein an upper portion of the strip-shaped isolation structure comprises a seam;
   a conductive residue, disposed in the seam;
   a plurality of columnar isolation structures, disposed between the bit lines and separated with each other; and
   a plurality of conductive plugs, disposed between the bit lines and separated from each other, wherein the conductive residue and the conductive plugs comprise the same conductive material.

2. The semiconductor memory device of claim 1, wherein the seam extends along the second direction and is discontinuously distributed in the strip-shaped isolation structure.

3. The semiconductor memory device of claim 1, wherein an opening of the seam comprises a width extending along the first direction, and the width is larger than 1 nm.

4. The semiconductor memory device of claim 1, wherein a width of the strip-shaped isolation structure in the first direction is larger than a width of each of the columnar isolation structures in the first direction.

5. The semiconductor memory device of claim 1, wherein the conductive residue is electrically insulated from the substrate.

6. The semiconductor memory device of claim 1, further comprising:
   an insulating layer, covering the strip-shaped isolation structure, the conductive residue and the columnar isolation structures.

7. The semiconductor memory device of claim 6, wherein a bottommost surface of the insulating layer is in direct contact with the conductive residue.

8. The semiconductor memory device of claim 1, further comprising:
   a plurality of filling patterns, wherein the filling patterns are disposed between the strip-shaped isolation structure and the columnar isolation structures.

9. The semiconductor memory device of claim 8, wherein the filling patterns are disposed at both sides of each of the strip-shaped isolation structures.

10. The semiconductor memory device of claim 1, wherein each of the columnar isolation structures comprises a cavity.

11. The semiconductor memory device of claim 10, wherein a bottommost surface of the seam is closer to the substrate than a bottommost surface of the cavity in the third direction.

12. The semiconductor memory device of claim 1, wherein the strip-shaped isolation structure is in partial contact with the plurality of bit lines.

13. The semiconductor memory device of claim 1, wherein each of the conductive plugs comprises a bottom conductive layer and a top conductive layer, wherein the material of the bottom conductive layer is different from the material of the top conductive layer, and the materials of the bottom conductive layer and the conductive residue are the same.

* * * * *